United States Patent
Ko (10) Patent No.: US 8,217,502 B2
(45) Date of Patent: Jul. 10, 2012

(54) INTEGRATED CIRCUIT PACKAGING SYSTEM WITH MULTIPART CONDUCTIVE PILLARS AND METHOD OF MANUFACTURE THEREOF

(75) Inventor: ChanHoon Ko, Incheon (KR)

(73) Assignee: Stats Chippac Ltd., Singapore (SG)

( * ) Notice: Subject to any disclaimer, the term of this patent is extended or adjusted under 35 U.S.C. 154(b) by 136 days.

(21) Appl. No.: 12/796,668

(22) Filed: Jun. 8, 2010

(65) Prior Publication Data

US 2011/0298125 A1    Dec. 8, 2011

(51) Int. Cl.
*H01L 23/498*   (2006.01)
*H01L 21/60*    (2006.01)

(52) U.S. Cl. ......... 257/686; 257/E23.069; 257/E21.506; 257/738; 257/777; 257/723; 257/724; 257/728; 257/737; 257/773; 257/774; 257/779; 257/782; 438/124

(58) Field of Classification Search ........... 257/E23.069, 257/E21.506, 686, 777, 723, 728, 727, 724, 257/774, 779, 782; 438/124
See application file for complete search history.

(56) References Cited

U.S. PATENT DOCUMENTS

| 7,791,206 | B2 * | 9/2010 | Takeuchi et al. | 257/774 |
| 7,888,785 | B2 * | 2/2011 | Ahn et al. | 257/686 |
| 7,923,290 | B2 * | 4/2011 | Ko et al. | 438/106 |
| 2008/0017968 | A1 | 1/2008 | Choi et al. | |
| 2008/0136003 | A1 | 6/2008 | Pendse | |
| 2009/0140408 | A1 | 6/2009 | Lee et al. | |
| 2009/0166835 | A1 * | 7/2009 | Yang et al. | 257/686 |
| 2009/0236752 | A1 | 9/2009 | Lee et al. | |
| 2009/0261466 | A1 * | 10/2009 | Pagaila et al. | 257/686 |
| 2010/0244242 | A1 * | 9/2010 | Komatsu et al. | 257/737 |
| 2011/0049695 | A1 * | 3/2011 | Shin et al. | 257/686 |
| 2011/0068453 | A1 * | 3/2011 | Cho et al. | 257/686 |
| 2011/0068468 | A1 * | 3/2011 | Lin et al. | 257/737 |
| 2011/0186994 | A1 * | 8/2011 | Ko et al. | 257/737 |
| 2011/0278741 | A1 * | 11/2011 | Chua et al. | 257/777 |
| 2011/0298119 | A1 * | 12/2011 | Cho et al. | 257/686 |

* cited by examiner

*Primary Examiner* — A O Williams
(74) *Attorney, Agent, or Firm* — Ishimaru & Associates LLP; Mikio Ishimaru; Stanley M. Chang (57) ABSTRACT

A method of manufacture of an integrated circuit packaging system includes: providing a pillar ball; mounting an interposer having a first functional side and a second functional side over the pillar ball and a semiconductor chip; encapsulating the interposer, the pillar ball, and the semiconductor chip with an encapsulation; forming a via through the first functional side and the second functional side of the interposer, and through the encapsulation to expose a portion of the pillar ball; and filling the via with a pillar post.

20 Claims, 7 Drawing Sheets

INTEGRATED CIRCUIT PACKAGING SYSTEM WITH MULTIPART CONDUCTIVE PILLARS AND METHOD OF MANUFACTURE THEREOF

TECHNICAL FIELD

The present invention relates generally to an integrated circuit packaging system, and more particularly to a system for utilizing a multipart conductive pillar in an integrated circuit packaging system.

BACKGROUND

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a pillar ball; mounting an interposer having a first functional side and a second functional side over the pillar ball and a semiconductor chip; encapsulating the interposer, the pillar ball, and the semiconductor chip with an encapsulation; forming a via through the first functional side and the second functional side of the interposer, and through the encapsulation to expose a portion of the pillar ball; and filling the via with a pillar post.

The present invention provides an integrated circuit packaging system, including: a pillar ball; a semiconductor chip mounted beside the pillar ball; an interposer having a first functional side and a second functional side mounted over the pillar ball and the semiconductor chip; an encapsulation that encapsulates the interposer, the pillar ball, and the semiconductor chip; and a pillar post with characteristics of having been formed through the first functional side and the second functional side of the interposer, and through the encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Figure 1:
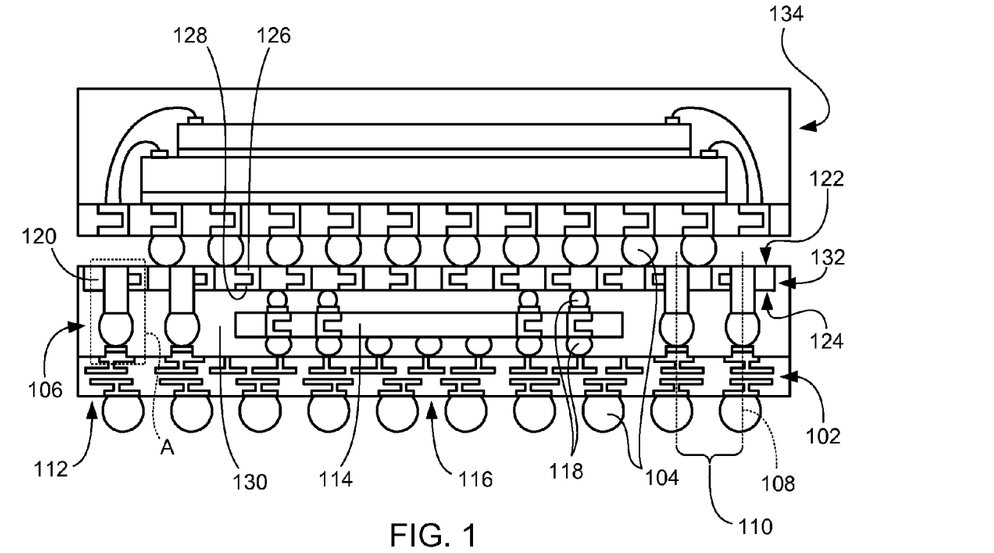
FIG. 1 is a cross-sectional view of an integrated circuit packaging system in an embodiment of the present invention.

Referring now to FIG. 1, therein is shown a cross-sectional view of an integrated circuit packaging system 100 in an embodiment of the present invention. The integrated circuit packaging system 100 is shown having a substrate 102 such as a laminated plastic or ceramic substrate 102.

Mounted below the substrate 102 are external interconnects 104 such as solder balls for system level integration. Mounted above the substrate 102 are multipart conductive pillars 106. The multipart conductive pillars 106 have centerlines 108 running vertically along the center of the multipart conductive pillars 106.

The multipart conductive pillars 106 also have a pitch 110. Pitch is defined herein as the distance between the centerlines 108 of the multipart conductive pillars 106. The multipart conductive pillars 106 are mounted along a perimeter 112 of the substrate 102 and surround a semiconductor chip such as a through silicon via die 114 that is mounted over a center 116 of the substrate 102.

The through silicon via die 114 is electrically connected to the substrate 102 with interconnects 118 such as solder ball interconnects. Mounted above the through silicon via die 114 is an interposer 120 and is electrically connected to the through silicon via die 114 with the interconnects 118. The interposer 120 is shown having two functional sides, such as a first functional side 122 and a second functional side 124, which allow for electrical signals to be routed between exposed conductors, such as exposed conductor 126, exposed from the first functional side 122, and exposed conductor 128, exposed from the second functional side 124.

The interposer 120 is typically a UV stabilized woven glass and epoxy resin with etched copper conductive pathways. Encapsulating the through silicon via die 114 and the multipart conductive pillars 106 is an encapsulation 130 such as film assisted molding, and helps protect sensitive components from moisture, dust and other contamination.

The multipart conductive pillars 106 are shown formed through the interposer 120, extending from the first functional side 122 to the second functional side 124. The multipart conductive pillars 106 are further shown as electrically connected to the exposed conductor 126, exposed from the first functional side 122, the exposed conductor 128, exposed from the second functional side 124, a combination there of, or electrically isolated from the interposer 120.

The multipart conductive pillars 106 are further shown extending through a portion of the encapsulation 130. The encapsulation 130 encapsulates side portions 132 of the interposer 120. Mounted above the interposer 120 is an external package 134. The external package 134 is electrically connected to the exposed conductors 126, exposed from the first functional side 122 of the interposer 120 with the external interconnects 104.

Figure 1A:
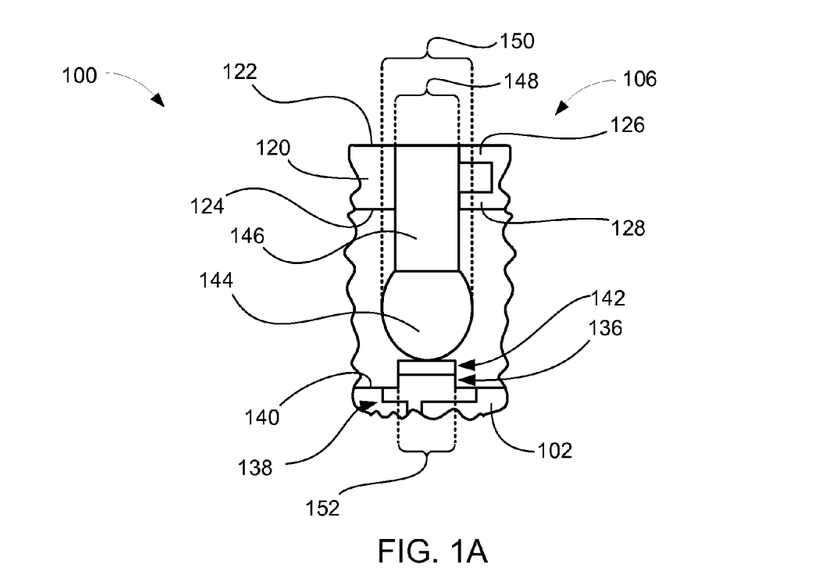
FIG. 1A is magnified region A of the integrated circuit packaging system of FIG. 1.

Referring now to FIG. 1A, therein is shown magnified region A of the integrated circuit packaging system 100 of FIG. 1. The integrated circuit packaging system 100 is shown having the multipart conductive pillar 106 in greater detail and mounted above the substrate 102.

The multipart conductive pillar 106 is shown as composed of a pillar base 136 in direct contact with the substrate 102. The pillar base 136 is attached to the substrate 102 with a recess 138 below a top surface 140 of the substrate 102. The pillar base 136 extends from within the substrate 102 and protrudes above the top surface 140 of the substrate 102. The pillar base 136 may be copper, gold, or other conductive materials.

Attached above the pillar base 136 the multipart conductive pillar 106 includes a pillar paste 142. The pillar paste 142 may be a solder paste and is used to connect a pillar ball 144 above the pillar base 136. The pillar ball 144 may be solder or electrically conductive polymer. The pillar ball 144 generally resembles a ball but the present invention does not require that the pillar ball 144 be spherical or even substantially spherical.

Attached above the pillar ball 144 the multipart conductive pillar 106 is shown having a pillar post 146 such as a copper or gold pillar. The pillar post 146 is shown formed through the interposer 120, extending from the first functional side 122 to the second functional side 124. The pillar post 146 is further shown as electrically connected to the exposed conductor 126, exposed from the first functional side 122, the exposed conductor 128, exposed from the second functional side 124, a combination there of, or electrically isolated from the interposer 120.

It has been discovered that the combination of the pillar ball 144 and the pillar post 146 produce a very fine pitch 110 (of FIG. 1) reducing overall integrated circuit packaging system size while allowing for a simple yet effective electrical connection between the interposer 120 and the substrate 102.

The multipart conductive pillar 106 is shown with the pillar post 146 having a width 148 substantially similar to or smaller than a width 150 of the pillar ball 144. Similarly, the width 150 of the pillar ball 144 is substantially similar to a width 152 of the pillar base 136.

Figure 2:
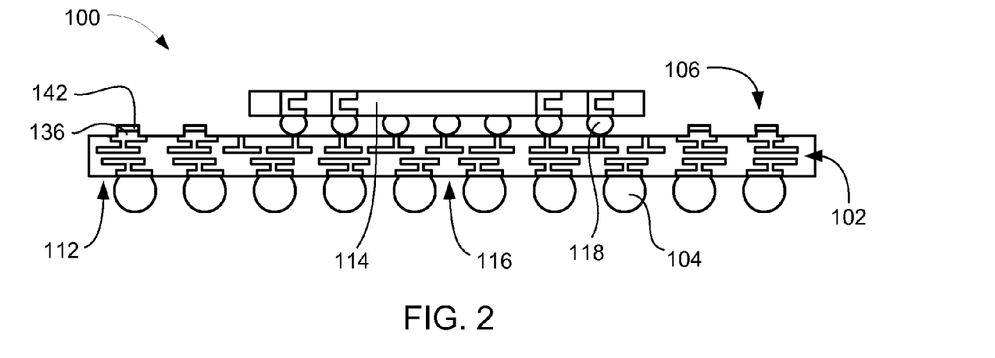
FIG. 2 is the integrated circuit packaging system of FIG. 1 after a chip attach phase of manufacture.

Referring now to FIG. 2, therein is shown the integrated circuit packaging system 100 of FIG. 1 after a chip attach phase of manufacture. The integrated circuit packaging system 100 is shown having the through silicon via die 114 mounted over the substrate 102 and attached thereto with the interconnects 118.

The through silicon via die 114 is shown mounted over the center 116 of the substrate 102 and with the multipart conductive pillars 106 having the pillar base 136 and the pillar paste 142 formed near the perimeter 112 of the substrate 102. Below the substrate 102 the external interconnects 104 are mounted.

Figure 3:
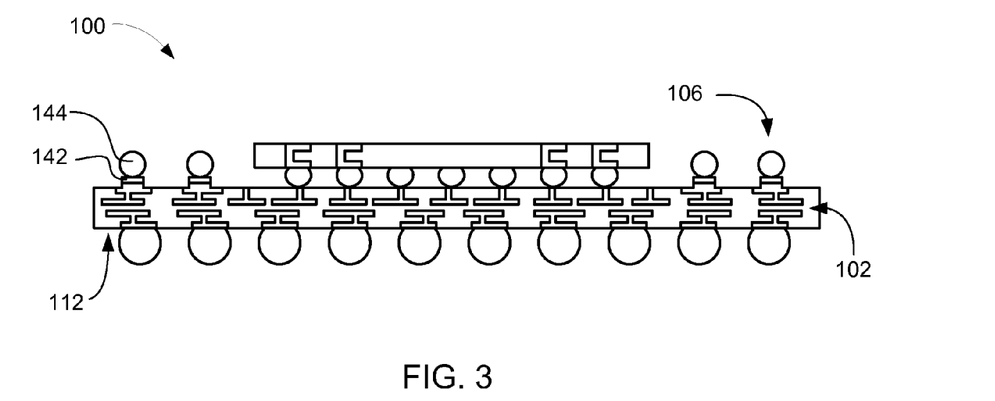
FIG. 3 is the integrated circuit packaging system of FIG. 1 after a ball attach phase of manufacture.

Referring now to FIG. 3, therein is shown the integrated circuit packaging system 100 of FIG. 1 after a ball attach phase of manufacture. The integrated circuit packaging system 100 is shown having the pillar balls 144 deposited above the pillar paste 142 of the multipart conductive pillars 106 along the perimeter 112 of the substrate 102.

Figure 4:
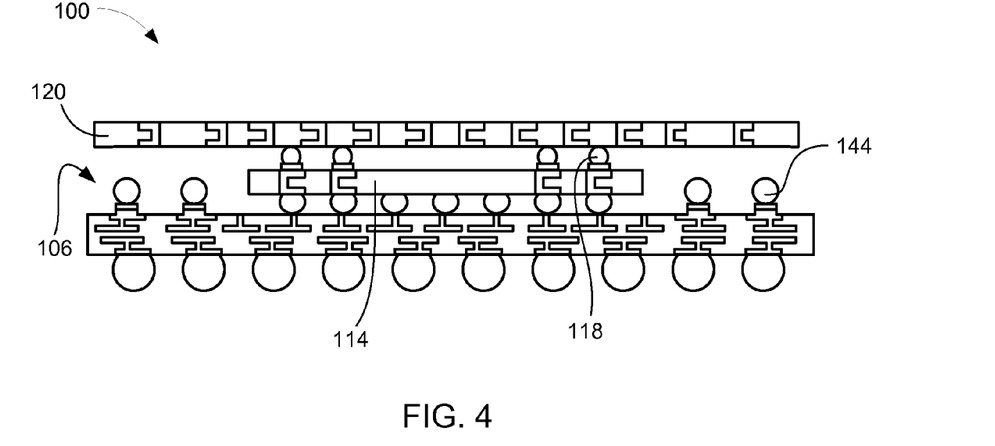
FIG. 4 is the integrated circuit packaging system of FIG. 1 after an interposer attach phase of manufacture.

Referring now to FIG. 4, therein is shown the integrated circuit packaging system 100 of FIG. 1 after an interposer attach phase of manufacture. The integrated circuit packaging system 100 is shown having the interposer 120 mounted above the through silicon via die 114 and attached thereto with the interconnects 118. The interposer 120 is shown extending laterally above the pillar balls 144 of the multipart conductive pillars 106.

Figure 5:
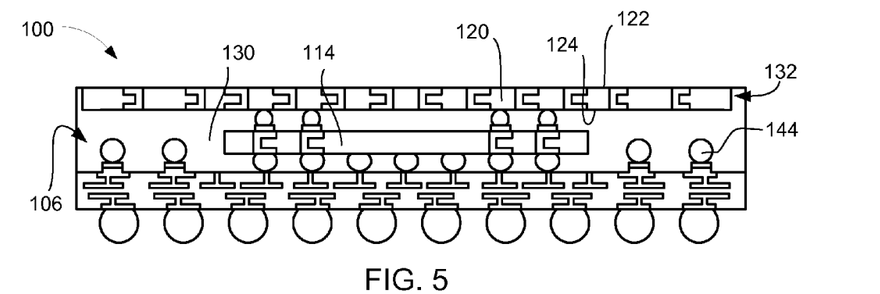
FIG. 5 is the integrated circuit packaging system of FIG. 1 after a molding phase of manufacture.

Referring now to FIG. 5, therein is shown the integrated circuit packaging system 100 of FIG. 1 after a molding phase of manufacture. The integrated circuit packaging system 100 is shown having the encapsulation 130 encapsulating the through silicon via die 114 and the pillar balls 144 of the multipart conductive pillars 106.

The encapsulation 130 is further shown encapsulating the second functional side 124 and side portions 132 of the interposer 120 but does not encapsulate the first functional side 122 of the interposer 120.

Figure 6:
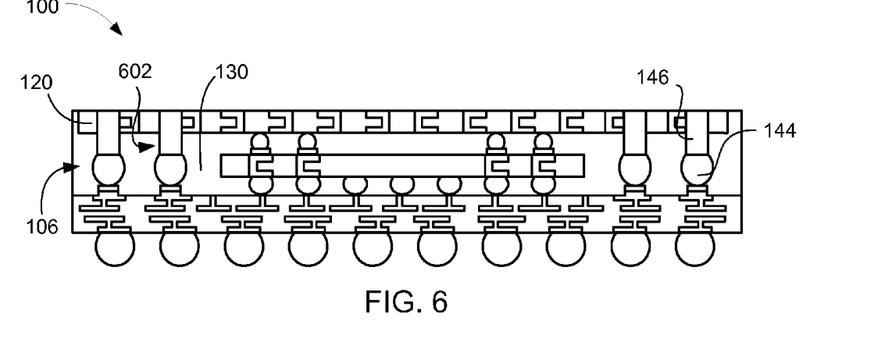
FIG. 6 is the integrated circuit packaging system of FIG. 1 after a via filling phase of manufacture.

Referring now to FIG. 6, therein is shown the integrated circuit packaging system 100 of FIG. 1 after a via filling phase of manufacture. The integrated circuit packaging system 100 is shown having the pillar post 146 formed above the pillar balls 144 of the multipart conductive pillars 106.

The pillar post 146 is formed by creating a via 602 through the interposer 120 and through the encapsulation 130 to expose a portion of the pillar ball 144. This via 602 may be created by a laser and then filled with conductive material such as copper or gold. It has been discovered that utilizing the pillar ball 144 in conjunction with the pillar post 146 to form the multipart conductive pillars 106 through the interposer 120 forms an electrical connection that is highly resilient to stresses while requiring less process time and cost.

The pillar post 146 may exhibit characteristics of having been formed through the interposer 120 and the encapsulation 130. The characteristics may include drilling marks or burning marks from the creation of the via 602 with a laser or other drilling device. Further, the pillar post 146 may exhibit characteristics of being formed into or having small irregularities created by filling irregular surfaces of the interposer 120 or encapsulation 130 along the via 602 after being formed with a laser or other drilling device.

Figure 7:
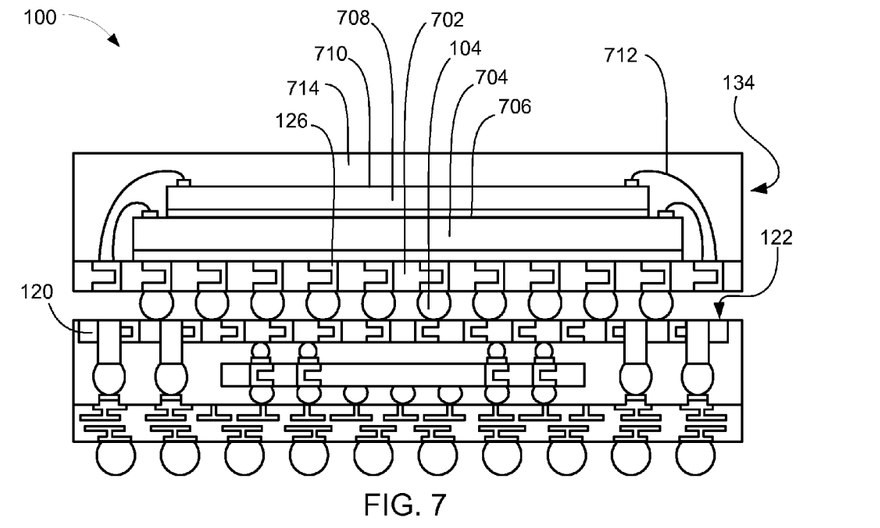
FIG. 7 is the integrated circuit packaging system of FIG. 1 after an external mounting phase of manufacture.

Referring now to FIG. 7, therein is shown the integrated circuit packaging system 100 of FIG. 1 after an external mounting phase of manufacture. The integrated circuit packaging system 100 is shown having the external package 134 electrically connected to the exposed conductors 126, exposed from the first functional side 122 of the interposer 120 with the external interconnects 104.

The external package 134 is shown having an external package substrate 702. Mounted above the external package substrate 702 is a first external package integrated circuit 704 with an active side 706 facing away from the external package substrate 702. Mounted above the first external package integrated circuit 704 is a second external package integrated circuit 708 with an active side 710 facing away from the first external package integrated circuit 704.

The active side 710 of the second external package integrated circuit 708 and the active side 706 of the first external package integrated circuit 704 are electrically connected to the external package substrate 702 with external package interconnects 712 such as bond wires. Encapsulating the first external package integrated circuit 704 and the second external package integrated circuit 708 is an external package encapsulation 714.

Figure 8:
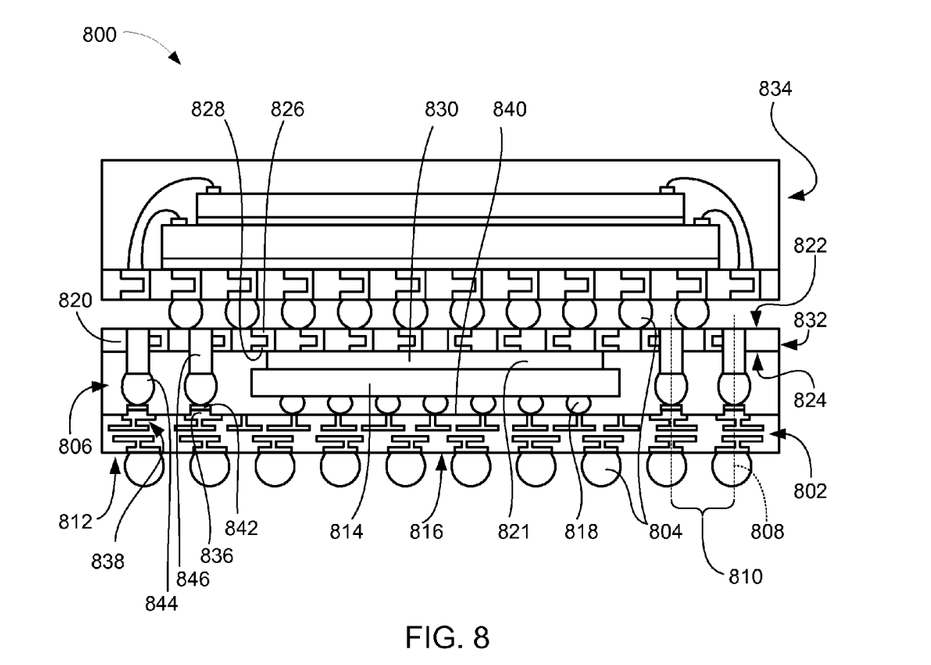
FIG. 8 is a cross-sectional view of an integrated circuit packaging system in an embodiment of the present invention.

Referring now to FIG. 8, therein is shown a cross-sectional view of an integrated circuit packaging system 800 in an embodiment of the present invention. The integrated circuit packaging system 800 is shown having a substrate 802 such as a laminated plastic or ceramic substrate 802.

Mounted below the substrate 802 are external interconnects 804 such as solder balls for system level integration. Mounted above the substrate 802 are multipart conductive pillars 806. The multipart conductive pillars 806 have centerlines 808 running vertically along the center of the multipart conductive pillars 806.

The multipart conductive pillars 806 also have a pitch 810. Pitch is defined herein as the distance between the centerlines 808 of the multipart conductive pillars 806. The multipart conductive pillars 806 are mounted along a perimeter 812 of the substrate 802 and surround a semiconductor chip such as a flip-chip 814 that is mounted over a center 816 of the substrate 802.

The flip-chip 814 is electrically connected to the substrate 802 with interconnects 818 such as solder ball interconnects. Mounted above the flip-chip 814 is an interposer 820 and is not electrically connected to the flip-chip 814 but is attached with an epoxy 821. The interposer 820 is shown having two functional sides, such as a first functional side 822 and a second functional side 824, which allow for electrical signals to be routed between exposed conductors, such as exposed conductor 826, exposed from the first functional side 822, and exposed conductor 828, exposed from the second functional side 824.

The interposer 820 is typically a UV stabilized woven glass and epoxy resin with etched copper conductive pathways. Encapsulating the flip-chip 814 and the multipart conductive pillars 806 is an encapsulation 830 such as film assisted molding, and helps protect sensitive components from moisture, dust and other contamination.

The multipart conductive pillars 806 are shown formed through the interposer 820, extending from the first functional side 822 to the second functional side 824. The multipart conductive pillars 806 are further shown as electrically connected to the exposed conductor 826, exposed from the first functional side 822, the exposed conductor 828, exposed from the second functional side 824, a combination there of, or electrically isolated from the interposer 820.

The multipart conductive pillars 806 are further shown extending through a portion of the encapsulation 830. The encapsulation 830 does not encapsulate side portions 832 of the interposer 820. Mounted above the interposer 820 is an external package 834. The external package 834 is electrically connected to the exposed conductors 826, exposed from the first functional side 822 of the interposer 820 with the external interconnects 804.

The multipart conductive pillar 806 is shown as composed of a pillar base 836 in direct contact with the substrate 802. The pillar base 836 is attached to the substrate 802 with a recess 838 below a top surface 840 of the substrate 802. The pillar base 836 may be copper, gold, or other conductive materials.

Attached above the pillar base 836 the multipart conductive pillar 806 includes a pillar paste 842. The pillar paste 842 may be a solder paste and is used to connect a pillar ball 844 above the pillar base 836. The pillar ball 844 may be solder or electrically conductive polymer. The pillar ball 844 generally resembles a ball but the present invention does not require that the pillar ball 844 be spherical or even substantially spherical.

Attached above the pillar ball 844 the multipart conductive pillar 806 is shown having a pillar post 846 such as a copper or gold pillar. The pillar post 846 is shown formed through the interposer 820, extending from the first functional side 822 to the second functional side 824. The pillar post 846 is further shown as electrically connected to the exposed conductor 826, exposed from the first functional side 822, the exposed conductor 828, exposed from the second functional side 824, a combination there of, or electrically isolated from the interposer 820.

An important aspect of the present invention is that the multipart conductive pillars 806 greatly reduces the pitch 810 between the multipart conductive pillars 806 which reduces the overall integrated circuit packaging system size while allowing for a simple yet effective electrical connection between the interposer 820 and the substrate 802.

Figure 9:
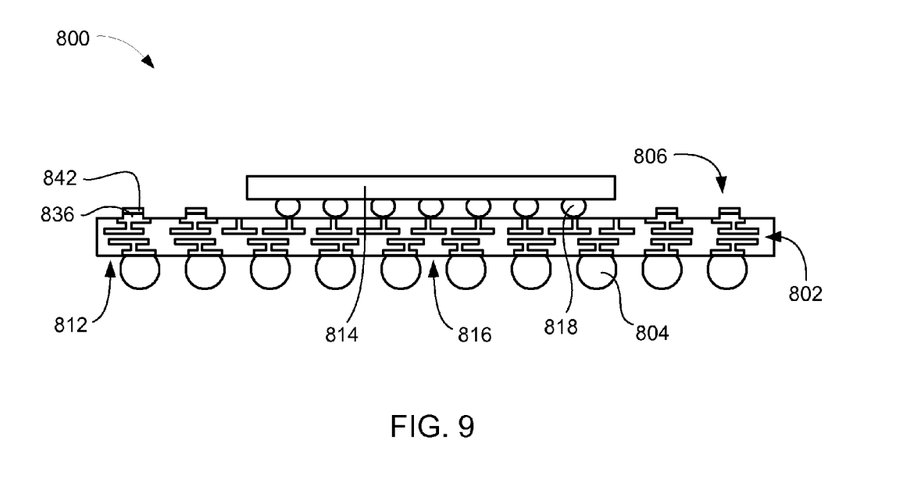
FIG. 9 is the integrated circuit packaging system of FIG. 8 after a chip attach phase of manufacture.

Referring now to FIG. 9, therein is shown the integrated circuit packaging system 800 of FIG. 8 after a chip attach phase of manufacture. The integrated circuit packaging system 800 is shown having the flip-chip 814 mounted over the substrate 802 and attached thereto with the interconnects 818.

The flip-chip 814 is shown mounted over the center 816 of the substrate 802 and with the multipart conductive pillars 806 having the pillar base 836 and the pillar paste 842 formed near the perimeter 812 of the substrate 802. Below the substrate 802 the external interconnects 804 are mounted.

Figure 10:
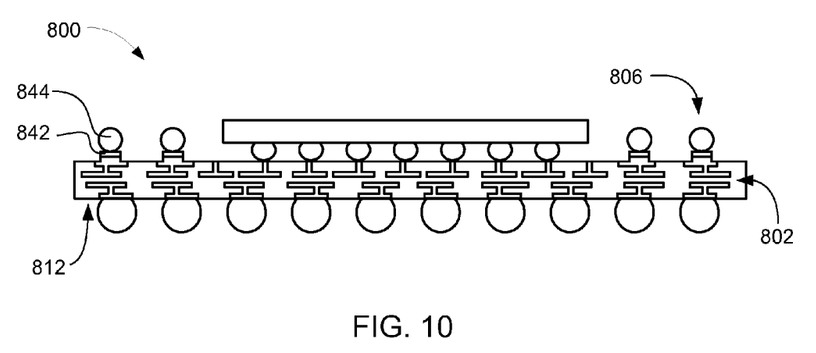
FIG. 10 is the integrated circuit packaging system of FIG. 8 after a ball attach phase of manufacture.

Referring now to FIG. 10, therein is shown the integrated circuit packaging system 800 of FIG. 8 after a ball attach phase of manufacture. The integrated circuit packaging system 800 is shown having the pillar balls 844 deposited above the pillar paste 842 of the multipart conductive pillars 806 along the perimeter 812 of the substrate 802.

Figure 11:
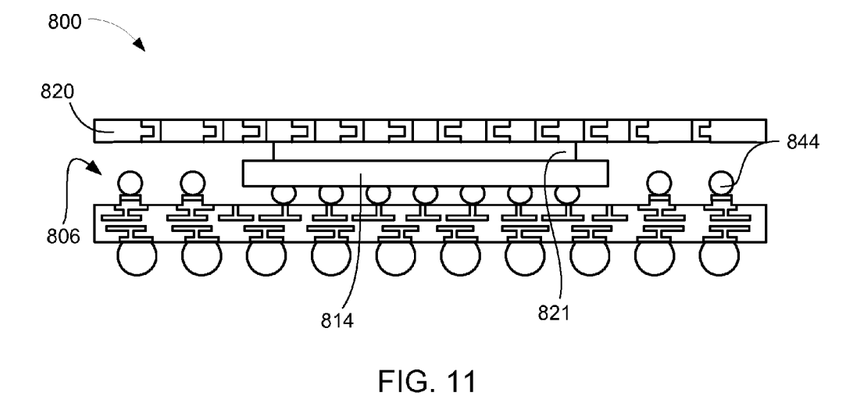
FIG. 11 is the integrated circuit packaging system of FIG. 8 after an interposer attach phase of manufacture.

Referring now to FIG. 11, therein is shown the integrated circuit packaging system 800 of FIG. 8 after an interposer attach phase of manufacture. The integrated circuit packaging system 800 is shown having the interposer 820 mounted above the flip-chip 814 and attached thereto with the epoxy 821. The interposer 820 is shown extending laterally above the pillar balls 844 of the multipart conductive pillars 806.

Figure 12:
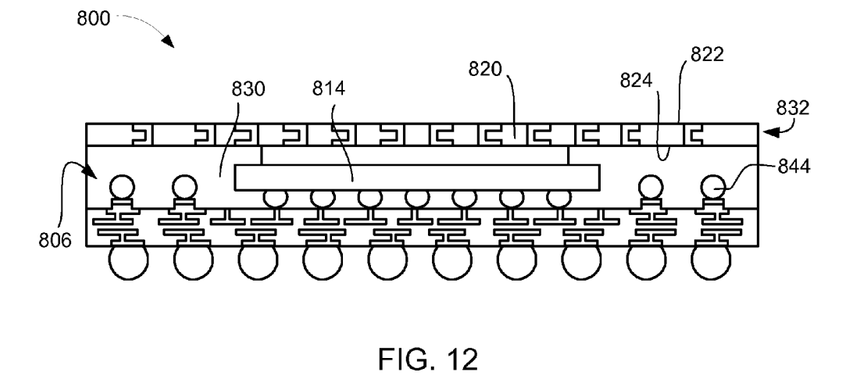
FIG. 12 is the integrated circuit packaging system of FIG. 8 after a molding phase of manufacture.

Referring now to FIG. 12, therein is shown the integrated circuit packaging system 800 of FIG. 8 after a molding phase of manufacture. The integrated circuit packaging system 800 is shown having the encapsulation 830 encapsulating the flip-chip 814 and the pillar balls 844 of the multipart conductive pillars 806.

The encapsulation 830 is further shown encapsulating the second functional side 824 but does not encapsulate the side portions 832 or the first functional side 822 of the interposer 820.

Figure 13:
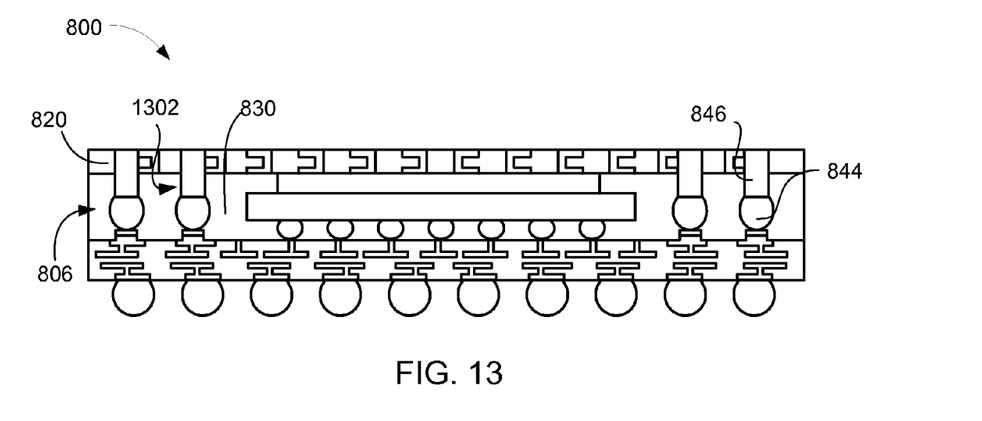
FIG. 13 is the integrated circuit packaging system of FIG. 8 after a via filling phase of manufacture.

Referring now to FIG. 13, therein is shown the integrated circuit packaging system 800 of FIG. 8 after a via filling phase of manufacture. The integrated circuit packaging system 800 is shown having the pillar post 846 formed above the pillar balls 844 of the multipart conductive pillars 806.

The pillar post 846 is formed by creating a via 1302 through the interposer 820 and through the encapsulation 830 to expose a portion of the pillar ball 844. This via 1302 may be created by a laser and then filled with conductive material such as copper or gold. Utilizing the pillar ball 844 in conjunction with the pillar post 846 to form the multipart conductive pillars 806 through the interposer 820 forms an electrical connection that is highly resilient to stresses while requiring less process time and cost.

Figure 14:
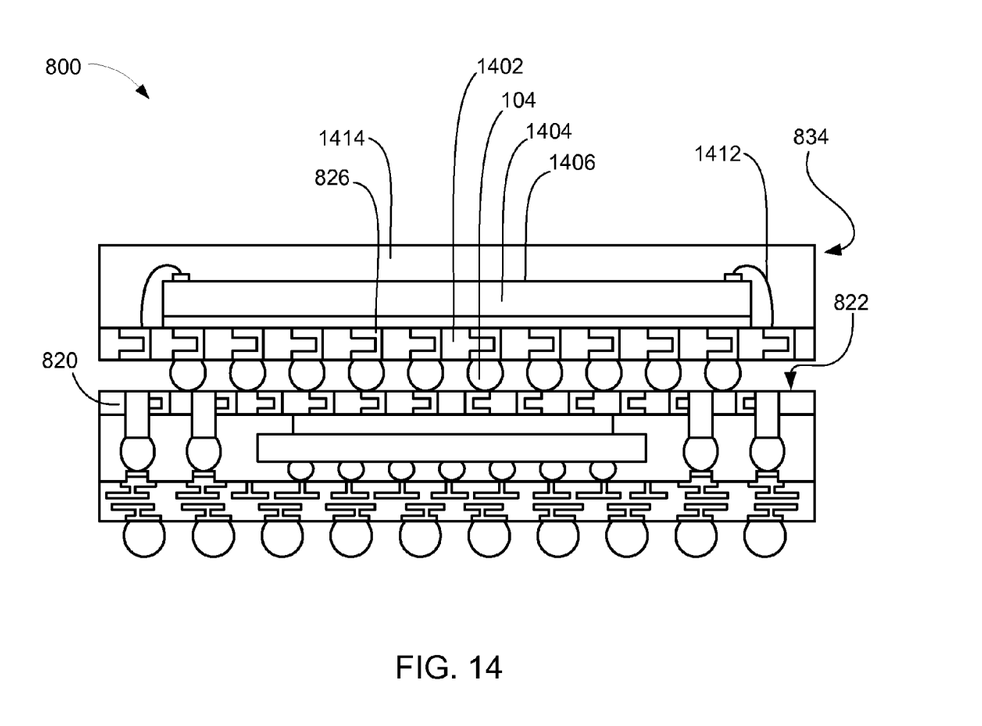
FIG. 14 is the integrated circuit packaging system of FIG. 8 after an external mounting phase of manufacture.

Referring now to FIG. 14, therein is shown the integrated circuit packaging system 800 of FIG. 8 after an external mounting phase of manufacture. The integrated circuit packaging system 800 is shown having the external package 834 electrically connected to the exposed conductors 826, exposed from the first functional side 822 of the interposer 820 with the external interconnects 804.

The external package 834 is shown having an external package substrate 1402. Mounted above the external package substrate 1402 is an external package integrated circuit 1404 with an active side 1406 facing away from the external package substrate 1402.

The active side 1406 of the first external package integrated circuit 1404 are electrically connected to the external package substrate 1402 with external package interconnects 1412 such as bond wires. Encapsulating the first external package integrated circuit 1404 and the second external package integrated circuit 1408 is an external package encapsulation 1414.

Figure 15:
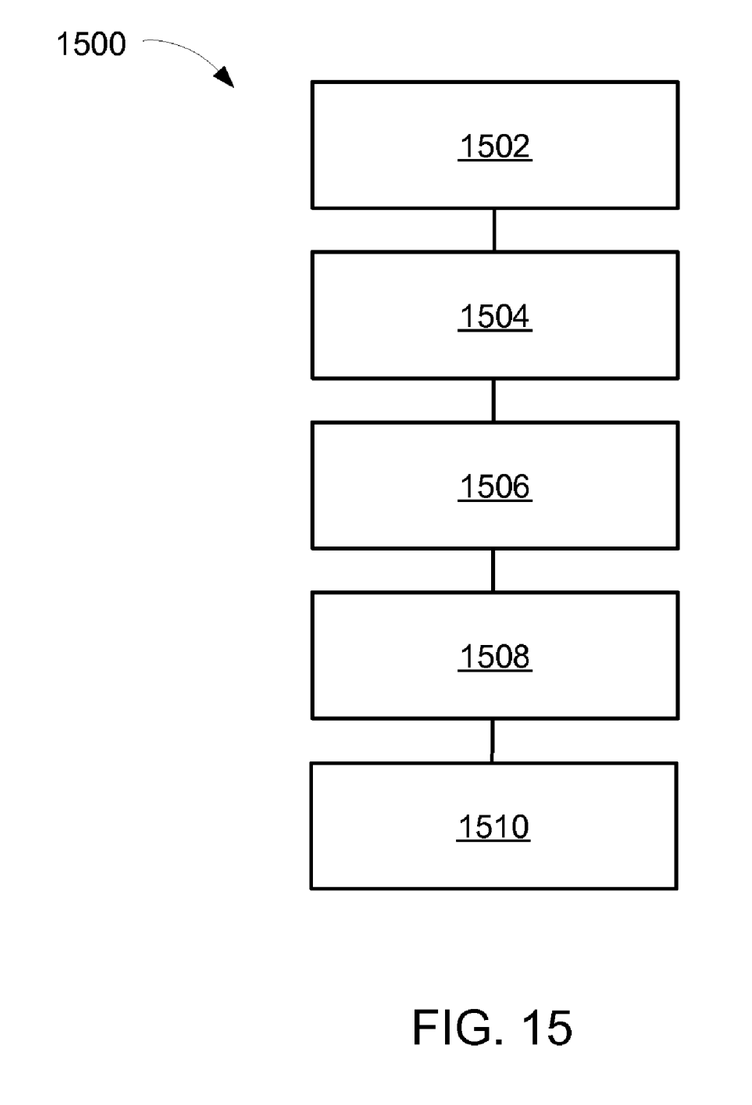
FIG. 15 is a flow chart of a method of manufacture of the integrated circuit packaging system of FIG. 1.

Referring now to FIG. 15, therein is shown a flow chart of a method 1500 of manufacture of the integrated circuit packaging system 100 of FIG. 1. The method 1500 includes providing a pillar ball in a block 1502; mounting an interposer having a first functional side and a second functional side over the pillar ball and a semiconductor chip in a block 1504; encapsulating the interposer, the pillar ball, and the semiconductor chip with an encapsulation in a block 1506; forming a via through the first functional side and the second functional side of the interposer, and through the encapsulation to expose a portion of the pillar ball in a block 1508; and filling the via with a pillar post in a block 1510.

Thus, it has been discovered that the multipart conductive pillar system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit packaging system comprising:
 forming a pillar base in a substrate extending from within the substrate and protruding above a top surface of the substrate;
 depositing a pillar ball above the pillar base;
 mounting an interposer having a first functional side and a second functional side over the pillar ball and a semiconductor chip;
 encapsulating the interposer, the pillar ball, and the semiconductor chip with an encapsulation;
 forming a via through the first functional side and the second functional side of the interposer, and through the encapsulation to expose a portion of the pillar ball; and
 filling the via with a pillar post.

2. The method as claimed in claim 1 wherein:
 filling the via with the pillar post includes the pillar post having a width substantially similar to or less than a width of the pillar ball.

3. The method as claimed in claim 1 wherein:
 mounting the interposer includes mounting the interposer having an exposed conductor exposed from the first functional side, and an exposed conductor exposed from the second functional side; and
 filling the via with the pillar post includes the pillar post formed electrically connected to the exposed conductor of the first functional side, the exposed conductor of the second functional side, a combination there of, or electrically isolated by the interposer.

4. The method as claimed in claim 1 further comprising:
 mounting an external package above the interposer and electrically connected thereto with external interconnects.

5. The method as claimed in claim 1 wherein:
 encapsulating the interposer includes leaving side portions exposed from the encapsulation.

6. A method of manufacture of an integrated circuit packaging system comprising:
 providing a substrate;
 forming a pillar base in the substrate extending from within the substrate and protruding above a top surface of the substrate;
 mounting a semiconductor chip above the substrate;
 mounting a pillar ball above the substrate;
 mounting an interposer having a first functional side and a second functional side over the pillar ball and the semiconductor chip;
 encapsulating the interposer, the pillar ball, and the semiconductor chip with an encapsulation;
 forming a via through the first functional side and the second functional side of the interposer, and through the encapsulation to expose a portion of the pillar ball; and
 filling the via with a pillar post.

7. The method as claimed in claim 6 wherein:
 providing the substrate includes providing the substrate having a recess below the top surface of the substrate; and
 forming the pillar base includes forming the pillar base in the recess and extending above the top surface of the substrate.

8. The method as claimed in claim 6 further comprising:
 depositing a pillar paste above the substrate; and
wherein:
 mounting the pillar ball includes mounting the pillar ball above the pillar paste.

9. The method as claimed in claim 6 wherein forming the pillar base includes forming the pillar base having a width substantially similar to a width of the pillar ball.

10. The method as claimed in claim 6 wherein:
 mounting the semiconductor chip includes mounting a through silicon via die a flip-chip connected to the interposer with interconnects, or a combination thereof.

11. An integrated circuit packaging system comprising:
 a substrate having a top surface;
 a pillar base in the substrate extends from within the substrate and protrudes above a top surface of the substrate;
 a pillar ball above the substrate and the pillar base;
 a semiconductor chip mounted beside the pillar ball;
 an interposer having a first functional side and a second functional side mounted over the pillar ball and the semiconductor chip;
 an encapsulation encapsulates the interposer, the pillar ball, and the semiconductor chip; and
 a pillar post with characteristics of having been formed through the first functional side and the second functional side of the interposer, and through the encapsulation.

12. The system as claimed in claim 11 wherein:
 the pillar post has a width substantially similar to or less than a width of the pillar ball.

13. The system as claimed in claim 11 wherein:
 the interposer has an exposed conductor exposed from the first functional side, and an exposed conductor exposed from the second functional side; and
 the pillar post is formed electrically connected to the exposed conductor of the first functional side, the exposed conductor of the second functional side, a combination there of, or electrically isolated by the interposer.

14. The system as claimed in claim 11 further comprising:
 an external package mounted above the interposer and electrically connected thereto with external interconnects.

15. The system as claimed in claim 11 wherein:
 the interposer has side portions exposed from the encapsulation.

16. The system as claimed in claim 11 further comprising:
 interconnects connect the semiconductor chip to the substrate; and
 external interconnects mounted below the substrate.

17. The system as claimed in claim 16 wherein:
 the substrate includes a recess formed below the top surface; and
 the pillar base is formed in the recess and extends above the top surface of the substrate.

18. The system as claimed in claim 16 further comprising:
 a pillar paste between the substrate and the pillar ball.

19. The system as claimed in claim 16 wherein the pillar base has a width substantially similar to a width of the pillar ball.

20. The system as claimed in claim 16 wherein:
 the semiconductor chip is a through silicon via die a flip-chip connected to the interposer with the interconnects, or a combination thereof.

* * * * *